(12) United States Patent
Zhang et al.

(10) Patent No.: US 8,686,773 B1
(45) Date of Patent: Apr. 1, 2014

(54) IN-SYSTEM MARGIN MEASUREMENT CIRCUIT

(71) Applicant: Lattice Semiconductor Corporation, Hillsboro, OR (US)

(72) Inventors: Fulong Zhang, Cupertino, CA (US); Chien Kuang Chen, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/721,867

(22) Filed: Dec. 20, 2012

Related U.S. Application Data

(60) Provisional application No. 61/714,636, filed on Oct. 16, 2012.

(51) Int. Cl.
*H03K 3/012* (2006.01)
(52) U.S. Cl.
USPC .......................................... 327/170; 327/171
(58) Field of Classification Search
USPC .................. 327/170–171, 262–263, 270–272
See application file for complete search history.

(56) References Cited

U.S. PATENT DOCUMENTS

| | | | |
|---|---|---|---|
| 5,122,978 A | 6/1992 | Merrill | |
| 6,518,808 B2 * | 2/2003 | Shimoda | 327/172 |
| 7,009,433 B2 | 3/2006 | Zhang et al. | |
| 7,317,644 B1 | 1/2008 | Lin et al. | |
| 7,495,495 B2 | 2/2009 | Zhang et al. | |
| 7,668,037 B2 | 2/2010 | Carpenter et al. | |
| 7,863,931 B1 | 1/2011 | Zhang et al. | |
| 7,983,094 B1 | 7/2011 | Roge et al. | |
| 8,269,534 B2 * | 9/2012 | Kim | 327/158 |
| 2006/0215467 A1 | 9/2006 | Partsch | |

* cited by examiner

*Primary Examiner* — An Luu

(57) ABSTRACT

A margin circuit for controlling skew between first and second signals in order to determine margin, includes a variable delay circuit and a margin controller. Based on a current code value, the delay circuit applies a delay to the second signal to generate a delayed second signal. The margin controller generates the current code value for the variable delay circuit to be any one of a plurality of available code values. In one embodiment, the margin circuit is a write margin circuit that generates a first clock signal and a delayed second clock signal used to generate transmit (TX) clock and data signals having a non-zero phase offset between them. In another embodiment, the margin circuit is a read margin circuit that applies a phase offset between receive (RX) clock and data signals to enable the RX clock signal to be used to recover data from the RX data signal.

20 Claims, 12 Drawing Sheets

(A)

(B)

(C)

430

410

1100

1200

IN-SYSTEM MARGIN MEASUREMENT CIRCUIT

CROSS-REFERENCE TO RELATED APPLICATIONS

This application claims the benefit of the filing date of U.S. provisional application No. 61/714,636, filed on Oct. 16, 2012, the teachings of which are incorporated herein by reference in their entirety. The subject matter of this application is related to U.S. Pat. No. 7,495,495, the teachings of which are incorporated herein by reference in their entirety.

TECHNICAL FIELD

The present invention relates to input/output (I/O) data communication and, in particular, to characterizing offset between clock and data signals.

BACKGROUND

This section introduces aspects that may help facilitate a better understanding of the invention. Accordingly, the statements of this section are to be read in this light and are not to be understood as admissions about what is prior art or what is not prior art.

The data valid window is defined as the stable data capture window by a clock at a first set of flip-flops at a receiver. As system interface performances continue to grow, the size of the data valid window for high-speed I/O interfaces available at customers' final products continues to shrink. This is especially true for high-speed memory interfaces like DDR3, LPDDR2, LPDDR3, and DDR4.

Before customers close the design of a system prior to high-volume production, there is a need to measure and monitor the data valid window of the system. Traditionally, this testing is performed on a small number of chip samples, which may result in problems being missed.

BRIEF DESCRIPTION OF THE DRAWINGS

Other embodiments of the disclosure will become more fully apparent from the following detailed description, the appended claims, and the accompanying drawings in which like reference numerals identify similar or identical elements.

DETAILED DESCRIPTION

Figure 1:
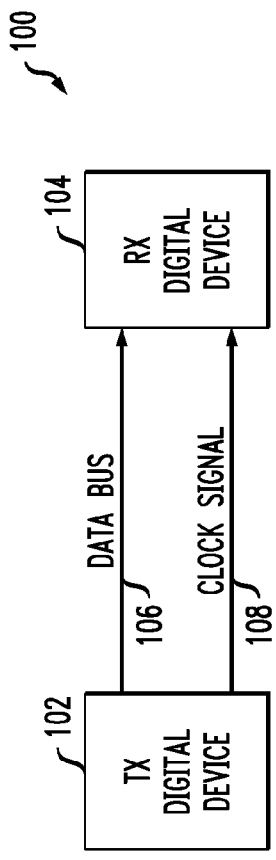
FIG. 1 illustrates a typical data bus interconnection scheme within an electronic system, according to one embodiment of the disclosure.

FIG. 1 illustrates a typical data bus interconnection scheme within an electronic system 100, according to one embodiment of the disclosure. In system 100, transmitting (TX) digital device 102 transmits to receiving (RX) digital device 104 (i) one or more data signals via data bus 106 and (ii) a clock signal 108. Depending on the particular implementation, digital devices 102 and 104 may be implemented within a single integrated circuit (IC) or on two different ICs.

The plurality of data signals within data bus 106 may contain parallel or serial data corresponding to any digitally represented information used within these devices. One skilled in the art will recognize that any suitable number of bits may be carried by data bus 106 depending on the particular application.

Clock signal 108 provides a reference clock signal that may be used by RX device 104 to sample the data signals transmitted over data bus 106. Clock signal 108 is typically a periodic clock signal that operates at a pre-determined clock frequency that may be used throughout system 100. In some systems, like memory interfaces, the clock consists of non-continuous bursts called strobes. However, a reference clock signal associated with a particular data bus is typically provided for each data bus within system 100 to account for different propagation delays or signal latencies that may exist within the transmitting digital devices. As such, clock signal 108 may differ in phase relative to other clock signals that may be present within system 100.

In order for RX device 104 to accurately recover data from the data signals transmitted over data bus 106, the received data signals are sampled on an edge of clock signal 108 during a data valid window that exists between possible transitions in the data signals. In real-world implementations, there are two conventional scenarios for transmitting clock and data signals from a transmitting device, such as TX device 102, to a receiving device, such as RX device 104.

In a first scenario, the transmitting device generates and transmits the clock and data signals with an appropriate (e.g., 90-degree or one-quarter clock cycle) phase shift between them, such that the receiving device can use the received clock signal to sample the received data signals during the data valid window without first having to apply any phase shift to either the clock signal or the data signals.

In a second scenario, the transmitting device generates and transmits clock and data signals that are aligned (i.e., in phase), and the receiving device applies a phase shift (e.g., 90 degrees or one-quarter clock cycle) to the clock signal, such that the shifted clock signal can be used to sample the data signals during the data valid window. In other implementations of this second scenario, the data signals can be shifted with respect to the received clock signal.

Although system 100 depicts a situation in which the clock and data signals are directly transmitted from TX device 102 to RX device 104, in alternative embodiments, the clock and data signals may be transmitted from TX device 102 to a storage device such as a computer memory and then subsequently read from that storage device by RX device 104. In general, the same notions of alignment and phase shifting for proper data recovery apply to those alternative embodiments as well.

Figure 2:
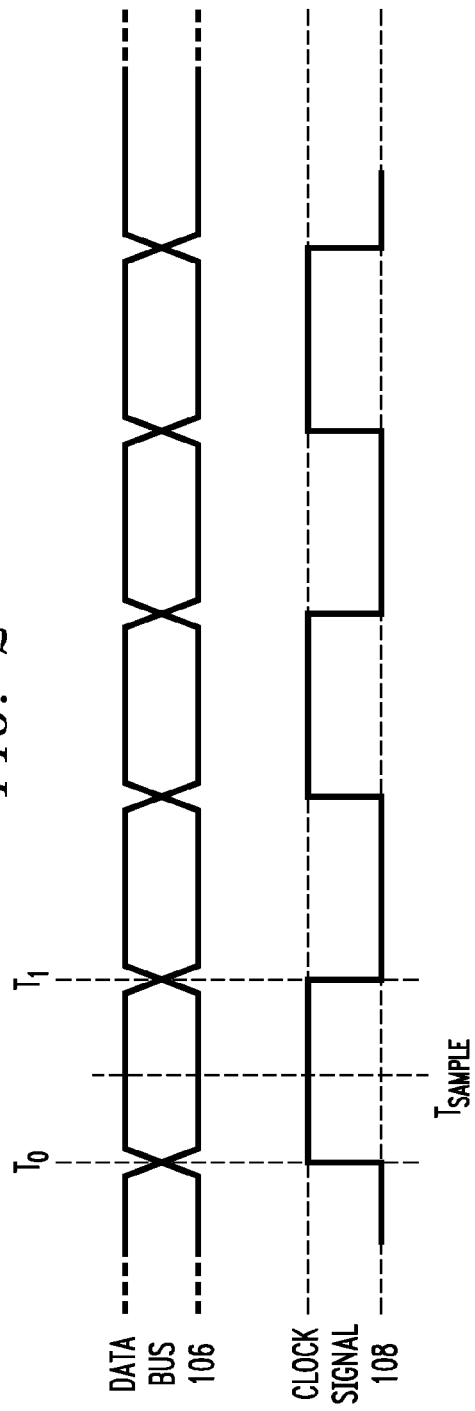
FIG. 2 illustrates a set of timing diagrams for the data bus and the clock signal of FIG. 1 for the scenario in which the transmitted clock and data signals are aligned in phase.

FIG. 2 illustrates a set of timing diagrams for data bus 106 and clock signal 108 of FIG. 1 for the second scenario in which the transmitted clock and data signals are aligned in phase. As represented in FIG. 2, data signals within data bus 106 and clock signal 108 are aligned in phase with each other in that the data signals present on data bus 106 may change state on either the rising edge or the falling edge of clock signal 108. When RX device 104 receives data signals on bus 106, I/O interfaces within RX device 104 need to sample these data signals during a time when these signals are both valid and stable. The data signals on bus 106 become valid and stable after time $T_0$, which corresponds to a rising edge of clock signal 108. These data signals may become unstable and/or invalid at time $T_1$, which corresponds to a falling edge of clock signal 108. Since the data signals are valid after $T_0$ and before $T_1$, the data signals may be safely sampled at time $T_{sample}$, which is a point in time between $T_0$ and $T_1$. Due to system noise, clock jitter, and skew between clock signal 108 and all of the data signals, $T_{sample}$ should be separated from both $T_0$ and $T_1$. Typically, time $T_{sample}$ corresponds to a point halfway between $T_0$ and $T_1$ to maximize a setup-and-hold window. For a clock signal having a 50% duty cycle, time Tsample corresponds to a 90-degree phase shift (i.e., a quarter of the period) of clock signal 108.

There are a number of different causes that can result in RX device 104 being unable to accurately recover data received over data bus 106. In general, in order to be able to recover data accurately, the shifted clock signal needs to be stable within the valid data window. That is, the rising and/or falling edges of the shifted clock signal should coincide with valid data periods in which the data signal has substantially settled to its logic 0 (e.g., low-voltage) level or its logic 1 (e.g., high-voltage) level.

Figure 3:
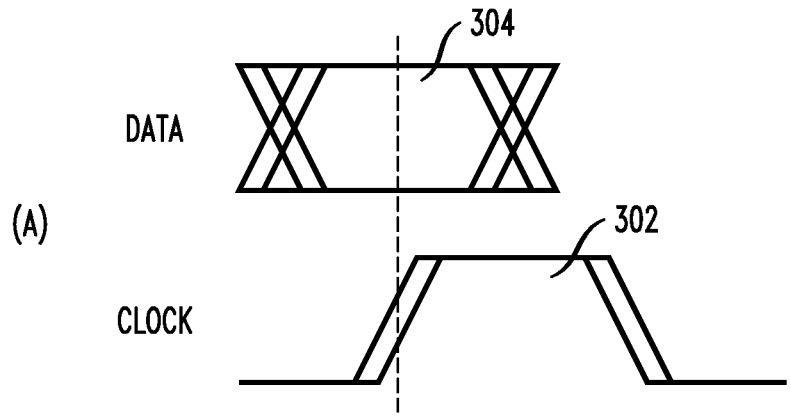
FIGS. 3(A)-(C) represent timing diagrams showing a shifted clock signal relative to a data signal for different signal conditions.
Figure 3:
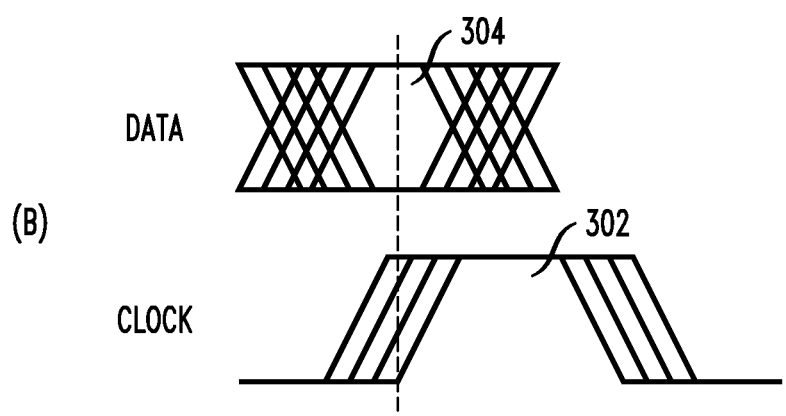
Figure 3:
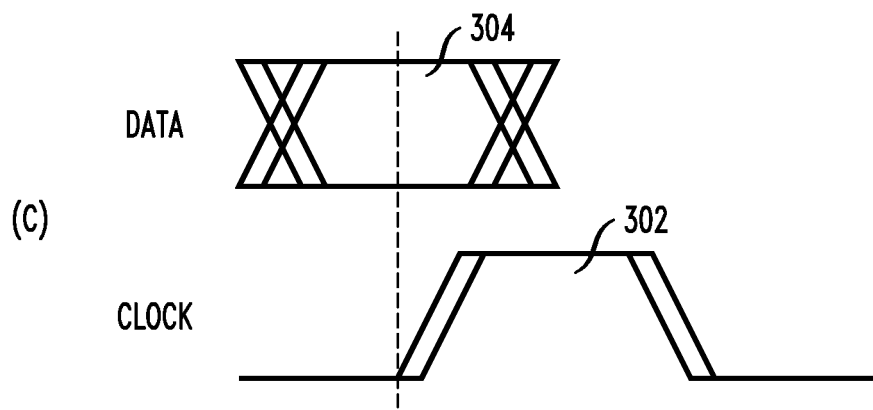

FIG. 3(A) represents a timing diagram in which data signal 304 is sampled on the rising edge of the shifted clock signal 302 and the clock signal is relatively stable within a valid data window for data signal 304. There is some jitter in both the clock and data signals, but it is at a relatively low level, such that the data valid period encompasses all clock edge jitter. This represents a situation in which RX device 104 of FIG. 1 would be able to accurately recover data from data bus 106.

FIG. 3(B) represents a timing diagram for a situation of relatively high system noise resulting in increased jitter in both the shifted clock signal 302 and data signal 304. In this situation, the data valid window is smaller, and the shifted clock signal 302 is not sufficiently stable within that smaller window, resulting in inaccurate data recovery by RX device 104.

FIG. 3(C) represents a timing diagram for a situation in which the offset between the shifted clock signal 302 and data signal 304 has deviated from its ideal 90-degree condition, e.g., as a result of PVT (process, voltage, and/or temperature) variations. Such system drift can also result in inaccurate data recovery by RX device 104.

In general, the jitter represented in FIG. 3(B) and the skew represented in FIG. 3(C) result from the combined effects of the signal processing characteristics of TX device 102 and RX device 104 as well as the signal transmission characteristics of data bus 106 and clock line 108. When designing and fabricating digital devices, such as TX device 102 and RX device 104, it is desirable to be able to characterize the skew between the data and clock signals within those devices. Based on such characterization, decisions can be made on the acceptability of particular device designs and/or particular devices. In addition, such characterization can be used to tune particular devices for improved operation.

Scenario #1: Offset TX Clock and Data Signals

Figure 4:
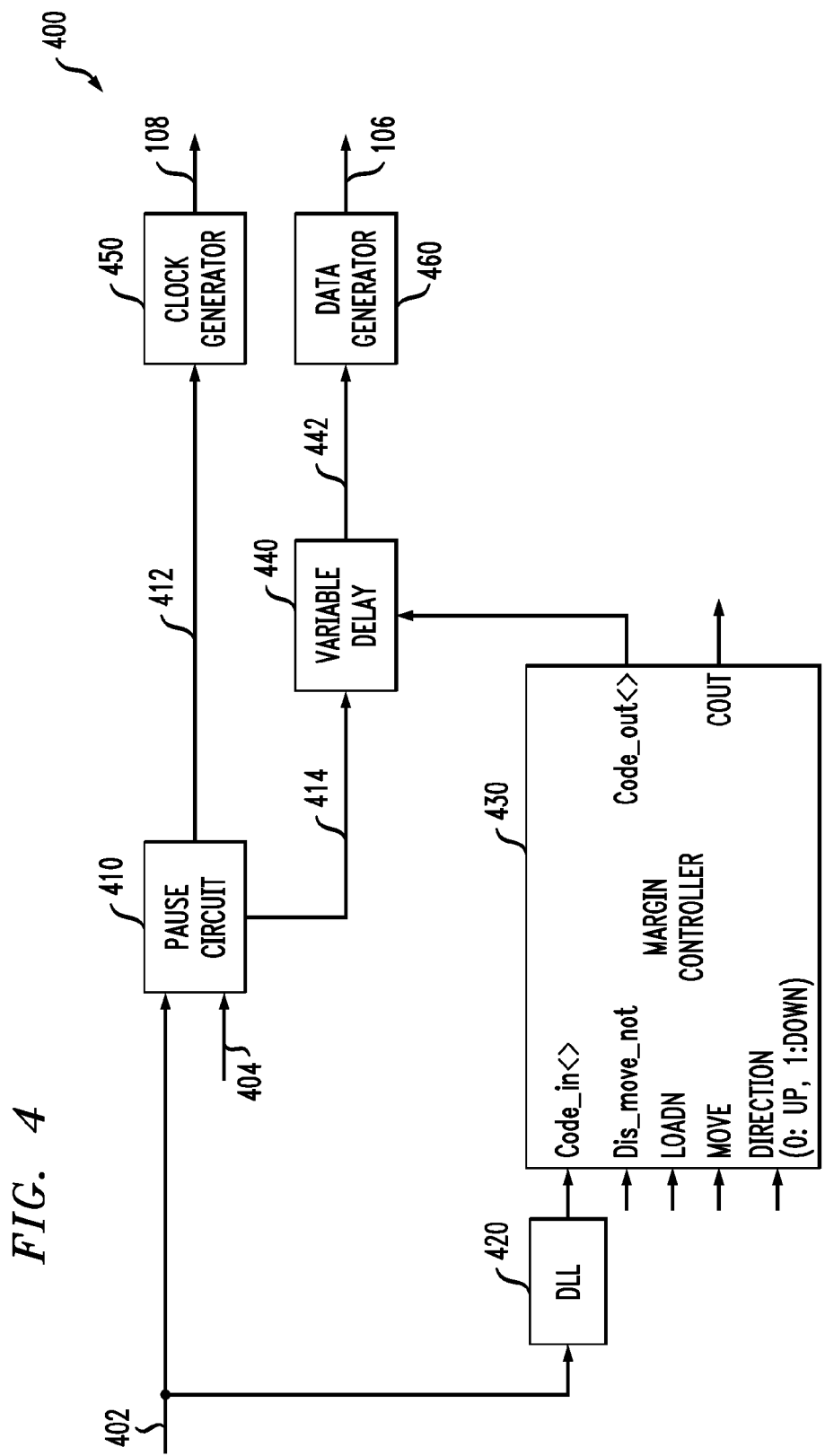
FIG. 4 shows a block diagram of a write margin circuit for a transmitting device, such as the TX device of FIG. 1, for the scenario in which the clock and data signals are transmitted with a non-zero phase offset.

FIG. 4 shows a block diagram of a write margin circuit 400 for a transmitting device, such as TX device 102 of FIG. 1, for the first scenario in which the clock and data signals are transmitted with a non-zero phase offset. Write margin circuit 400 receives an input clock signal 402 and generates two output clock signals: a first output clock signal 412 to be used by downstream TX circuitry 450 to generate transmitted clock signal 108 of FIG. 1 and a second output clock signal 442 to be used by downstream TX circuitry 460 to generate the transmitted data signals for data bus 106 of FIG. 1.

In operation, variable delay circuit 440 delays a copy 414 of input clock signal 402 based on a digital code signal code_out received from margin controller 430 to generate second output clock signal 442. In an ideal situation, margin controller 430 generates the value of code_out to cause variable delay circuit 440 to apply a 90-degree delay to clock signal 414 to generate second output clock signal 442 having a 90-degree phase offset relative to first output clock signal 412, where the 90-degree delay corresponds to one fourth of the duty cycle of input clock signal 402, such that the data signals generated by the downstream TX circuitry and transmitted on data bus 106 of FIG. 1 have a 90-degree phase offset relative to clock signal 108 generated by the downstream TX circuitry.

In the real world, certain factors, such as PVT variations and system noise, can cause skew between the data signals on data bus 106 and clock signal 108, which can vary from chip design to chip design, from TX device to TX device for a given chip design, and/or from time to time for a given TX device. In order to characterize this data/clock skew, margin controller 430 is designed to vary the value of code_out over time to characterize the performance of TX device 102 for different code values. For example, for an exemplary 8-bit code signal code_out, the decimal value 127 may correspond to a 90-degree phase shift applied by variable delay circuit 440, the decimal value 0 may correspond to a 45-degree phase shift, and the decimal value 255 may correspond to a 135-degree phase shift. In other implementations, code_out can have a number of bits other than 8 and/or the range of available phase shifts can be other than 45 degrees to 135 degrees.

In order to characterize the performance of TX device 102, margin controller 430 could be initiated to generate a nominal code_out value of 127 and then sequentially increment that nominal value by one towards the maximum value of 255. At each different code_out value, the performance of TX device 102 can be characterized by determining whether a receiving device, such as RX device 104 of FIG. 1, can accurately recover the received data from data bus 106 using the received clock signal 108. When the data can no longer be accurately recovered or the maximum code_out value of 255 is reached, margin controller 430 can be re-initiated to generate the nominal code_out value of 127 and then sequentially decrement that nominal value by one towards the minimum value of 0. Here, too, at each different code_out value, the performance of TX device 102 is characterized by determining whether RX device 104 can accurately recover the received data from data bus 106 using the received clock signal 108. When the data can no longer be accurately recovered or the minimum code_out value of 0 is reached, the characterization process for TX device 102 is complete. Note that, in other implementations, a minimum value other than 0 and/or a maximum value other than 255 can be defined for an 8-bit code_out value.

At that point, the transmit data/clock skew range (a.k.a. TX margin) corresponds to the range of code_out values from the smallest code_out value at which data can be reliably recovered to the largest code_out value at which data can be reliably recovered. The TX margin can then be used to determine the efficacy of the corresponding chip design and/or the instant TX device. The TX margin can also be used to adjust the tuning of the instant TX device, e.g., by selecting a code_out value at the center of the TX margin range for use in operating the device.

As shown in FIG. 4, margin controller 430 receives four digital input signals (multi-bit code_in, one-bit loadn, one-bit move, and one-bit direction) and generates two digital output signals (multi-bit code_in and one-bit cout). code_in, which has the same number of bits as code_out, represents the nominal code_out value (i.e., 127 in the previous example). direction indicates whether margin controller 430 increments (e.g., direction=0) or decrements (e.g., direction=1) the value of code_out at each iteration. move is a control signal that instructs margin controller 430 to change (i.e., increment or decrement) the code_out value. In one implementation, margin controller 430 changes the code_out value one time for each pulse in the control signal move. If there are no further pulses in move, then margin controller 430 will maintain the most-recent code_out value indefinitely. loadn instructs margin controller 430 to (i) reset the code_out value to the nominal code_in value (e.g., loadn=0) or (ii) allow the code_out value to be changed from that nominal code_in value (e.g., loadn=1). Note that a loadn value of 0 essentially disables the control signal move causing margin controller 430 to ignore pulses in move and keep the code_out value set to the nominal code_in value.

Cout is a carry-out control signal that indicates when either the maximum code_out value (e.g., 255 in the previous example) or the minimum code_out value (e.g., 0 in the previous example) has been reached. In particular, when (i) direction=0 indicating that margin controller 430 is incrementing code_out and (ii) the maximum code_out value has been reached, then Cout goes high. Similarly, when (i) direction=1 indicating that margin controller 430 is decrementing code_out and (ii) the minimum code_out value has been reached, then Cout also goes high.

As shown in FIG. 4, the nominal code_in value is generated by a delay-locked loop (DLL) circuit 420 based on the input clock signal 402. Typically, the nominal code_in value corresponds to a 90-degree phase shift in input clock signal 402 and has a value in the middle of the range of possible code_out values, such as 127 for an 8-bit code_out signal, although other values for the nominal code_in signal are also possible.

In addition, write margin circuit 400 also includes pause circuit 410 which selectively pauses the generation of the first and second output clock signals 412 and 442 based on a pause control signal 404. When pause circuit 410 is enabled, the first and second output clock signals 412 and 442 are, e.g., both driven low. When pause circuit 410 is disabled, the generation of output clock signals 412 and 442 is resumed. Pause circuit 410 is design to ensure that the output clock signals 412 and 442 are terminated and resumed at appropriate clock boundaries (e.g., only rising edges) of input clock signal 402. When the data rate of data bus 106 is greater than the data rate internal to TX device 102 (i.e., a gearing ratio of greater than one and typically an integer exponent of two, e.g., 2, 4, 8), pause circuit 410 is designed to ensure that the output clock signals 412 and 442 are terminated and resumed at appropriate clock boundaries corresponding to that gearing ratio, e.g., every 2, 4, or 8 clock cycles.

Figure 5:
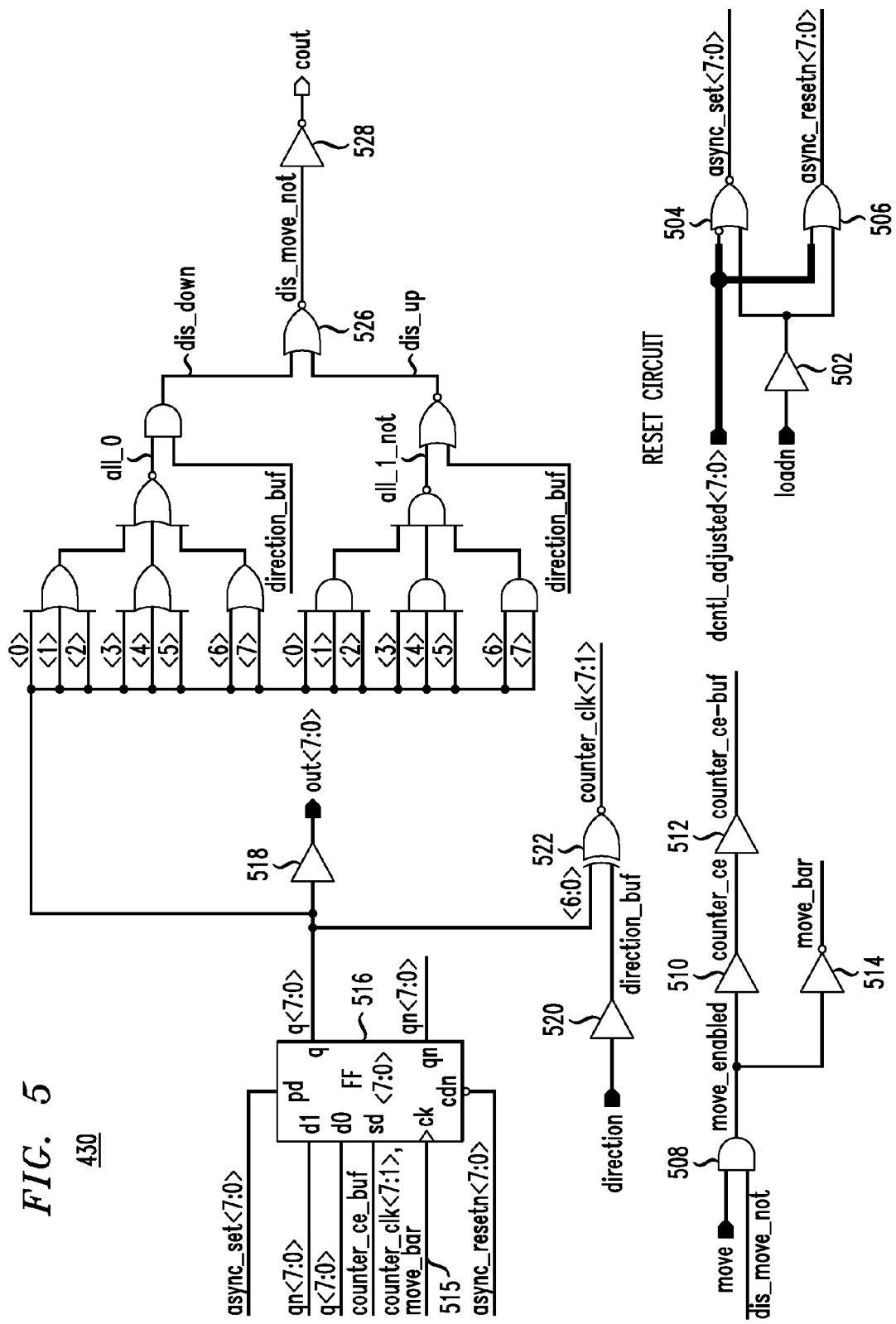
FIG. 5 shows a schematic circuit diagram of one possible 8-bit implementation of the margin controller of FIG. 4.

FIG. 5 shows a schematic circuit diagram of one possible 8-bit implementation of margin controller 430 of FIG. 4.

Input buffer 502 provides one-bit reset control signal loadn to eight parallel NOR gates 504 and eight parallel OR gates 506, each of both of which also receive a different corresponding bit of the 8-bit code_in value. Note that the code_in bits are inverted at the inputs to NOR gates 504. NOR gates 504 generate 8-bit asynchronous set signal async_set, while OR gates 506 generate 8-bit asynchronous reset signal async_resetn according to the Logic Table I, where "x" means "don't care."

LOGIC TABLE I

| loadn | code_in | async_set | async_resetn |
|---|---|---|---|
| 0 | 0 | 0 | 0 |
| 0 | 1 | 1 | 1 |
| 1 | x | 0 | 1 |

The logic circuitry of AND gate 508, buffers 510 and 512, and inverter 514 receives the move and dis_move_not signals and generates the control signals counter_ce_buf and move_bar according to Logic Table II. The one-bit dis_move_not signal, which is generated by NOR gate 526, indicates that the code_out value is equal to either the maximum or minimum allowable value. In that case, margin controller 430 is disabled from continuing to increment the code_out value above the maximum allowable value or decrement the code_out value below the minimum allowable value. As indicated by Logic Table II, when dis_move_not is high, counter_ce_buf is equal to move, and move_bar is equal to the logical inversion of move, such that margin controller 430 is able to change the code_out value based on a move pulse. On the other hand, when dis_move_not is low, counter_ce_buf is low and move_bar is high independent of the value of move, such that margin controller 430 is disabled from changing the code_out value from its present maximum or minimum value.

LOGIC TABLE II

| Move | dis_move_not | counter_ce_buf | move_bar | cout |
|---|---|---|---|---|
| 0 | 1 | 0 | 1 | 0 |
| 1 | 1 | 1 | 0 | 0 |
| X | 0 | 0 | 1 | 1 |

Note that, as indicated in Logic Table II and as shown in FIG. 5, inverter 528 generates the carry-out signal cout as the logical inversion of the dis_move_not signal, such that cout=1 indicates that the maximum code_out value has been reached while incrementing code_out or that the minimum code_out value has been reached while decrementing code_out, while cout=0 indicates that the maximum code_out value has not yet been reached while incrementing code_out or that the minimum code_out value has not yet been reached while decrementing code_out.

As shown in FIG. 5, the bits of the 8-bit value q generated by 8 flip-flops 516 are applied to 8 output buffers 518 to generate the current 8-bit code_out value. In addition, the buffered direction signal from input buffer 520 and the 7

LSBs (least significant bits) of the 8-bit value q are applied to 7 XNOR gates 522 to generate the 7 bits of signal counter_clk. The combination of inverter 514, the 7 XNOR gates 522, and the 8 flip-flops 516 function as a counter that either increments or decrements the value of q depending on the value of direction. Note that the 7 bits of counter_clk correspond to the 7 MSBs (most significant bits) of an 8-bit flip-flop clocking signal 515 applied to the clock input ports of the eight flip-flops 516, where the move_bar signal forms the LSB of that clocking signal 515 applied to the clock input port of the corresponding flip-flop 516.

Note that the q and qn outputs from each flip-flop 516 are reapplied to the d0 and d1 inputs, respectively, of that flip-flop. If the data-selection signal counter_ce_buf has a value of 0, then each flip-flop 516 forwards (i) its d0 input to its q output and (ii) its d1 input 1 to its qn output. If, on the other hand, the data-selection signal counter_ce_buf has a value of 1, then each flip-flop 516 forwards (i) its d1 input to its q output and (ii) its d0 input 1 to its qn output.

The 8-bit q value is also applied to combinatorial logic 524, which includes NOR gate 526 and inverter 528 and which, in this implementation of margin controller 430, processes the 8 bit values to determine whether the next q value would be all 1s (i.e., the maximum code_out value) or all 0s (i.e., the minimum code_out value), in which cases dis_move_not is set to 0 and cout is set to 1. The combinatorial logic stops at the minimum code_out value, when direction=1, and at the maximum code_out value, when direction=0. When the active-low parameter dis_move_not=0, move is disabled.

When incrementing, after the code_out value reaches its maximum value (e.g., 255), margin controller 430 stops code_out from rolling from that maximum value to its minimum value (e.g., 0). Similarly, when decrementing, after the code_out value reaches its minimum value (e.g., 0), margin controller 430 stops code_out from rolling from that minimum value to its maximum value (e.g., 255). A value of 1 for async_set will force the q output of flip-flop 516 to be 1, while a value of 0 for async_resetn will force the q output of flip-flop 516 to be 0.

Figure 6:
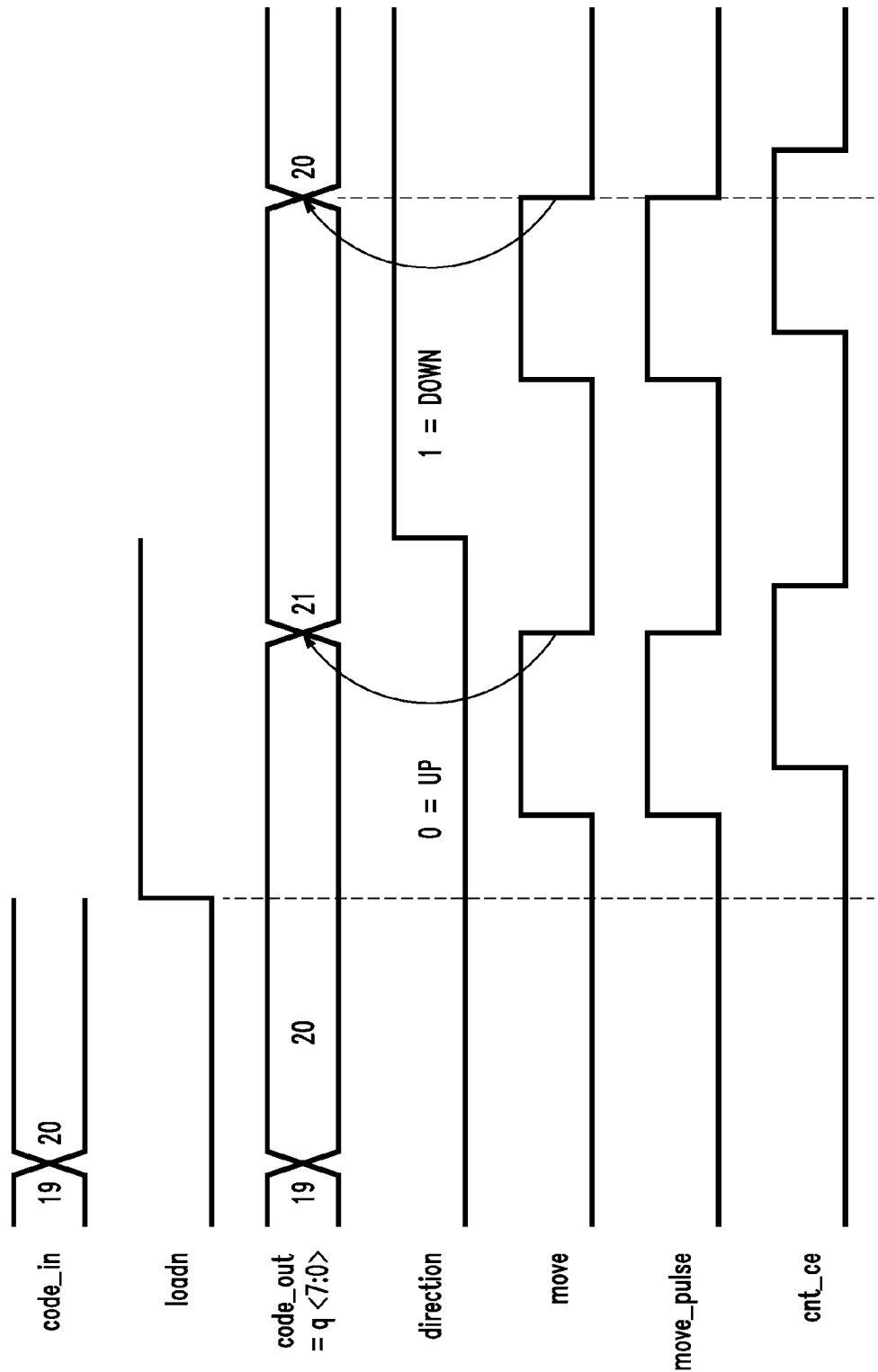
FIG. 6 shows a timing diagram representing some of the processing implemented by the margin controller of FIG. 5.

FIG. 6 shows a timing diagram representing some of the processing implemented by margin controller 430 of FIG. 5. When loadn is low, code_in will be copied to code_out. After loadn goes high, direction and move will control how code_out values are modified. In particular, when direction=0, a pulse on move will increase code_out by 1. When direction=1, a pulse on move will decrease code_out by 1.

Figure 7:
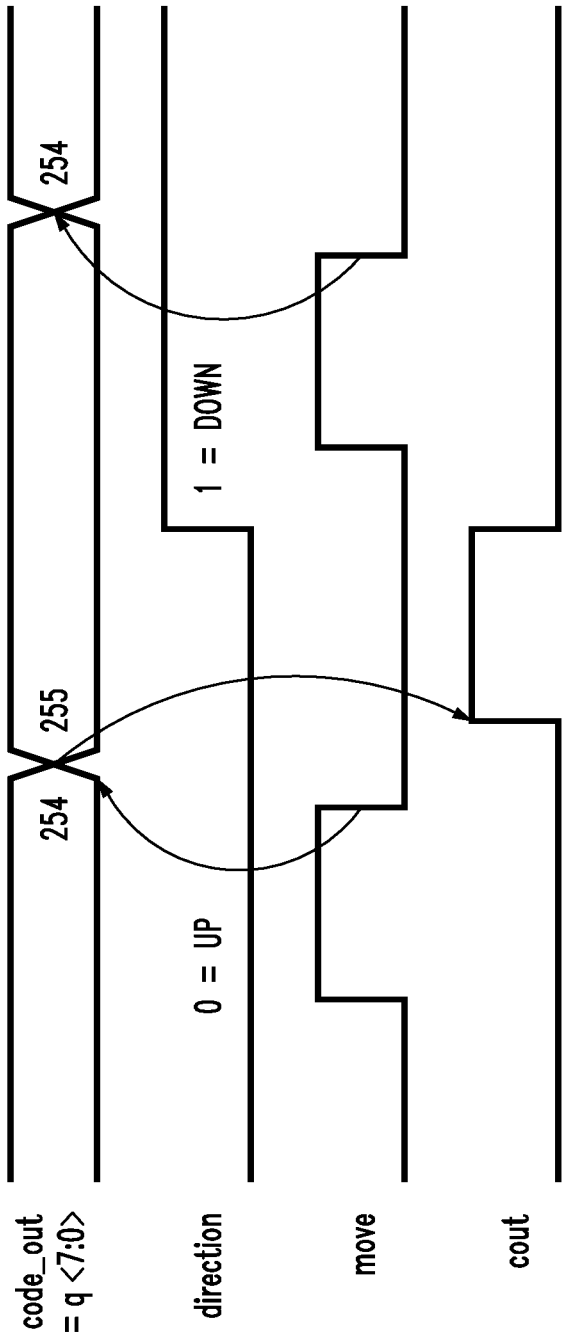
FIG. 7 shows a timing diagram for overflow flag COUT of FIG. 5 when reaching its maximum value.

FIG. 7 shows a timing diagram for the overflow flag COUT of FIG. 5 when reaching its maximum value (e.g., 255). In particular, if direction=0 and code_out reaches its maximum value of 255, then the COUT flag will go high. Any move pulse when COUT=1 will have no effect on code_out. If the user changes direction to 1, then the COUT flag will go low and, on the next move pulse, code_out will decrease by 1 to 254.

Figure 8:
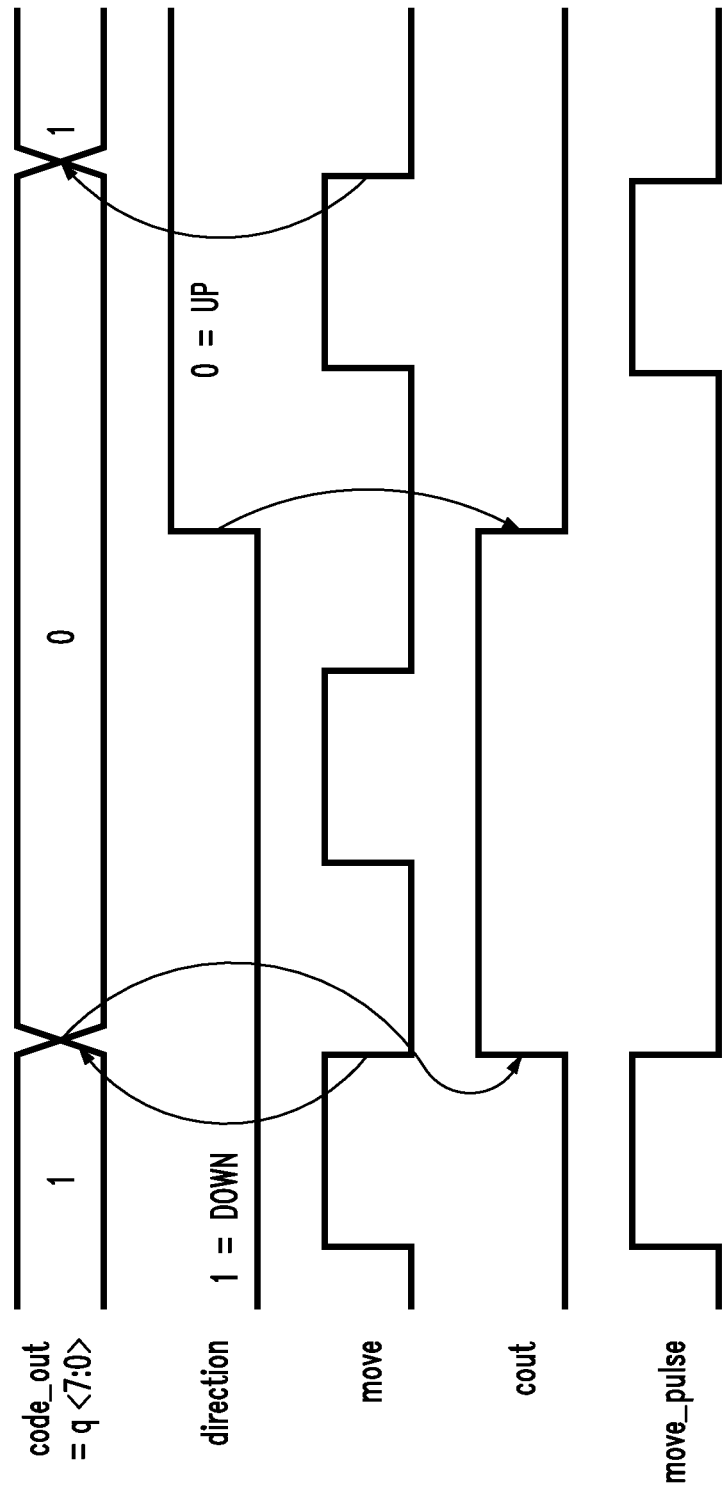
FIG. 8 shows a timing diagram for overflow flag COUT of FIG. 5 when reaching its minimum value.

FIG. 8 shows a timing diagram for the overflow flag COUT of FIG. 5 when reaching its minimum value (e.g., 0). In particular, if direction=1 and code_out reaches its minimum value of 0, then the COUT flag will go high. Any move pulse when COUT=1 will have no effect on code_out. If the user changes direction to 0, then the COUT flag will go low and, on the next move pulse, code_out will increase by 1 (e.g., to 1).

Figure 9:
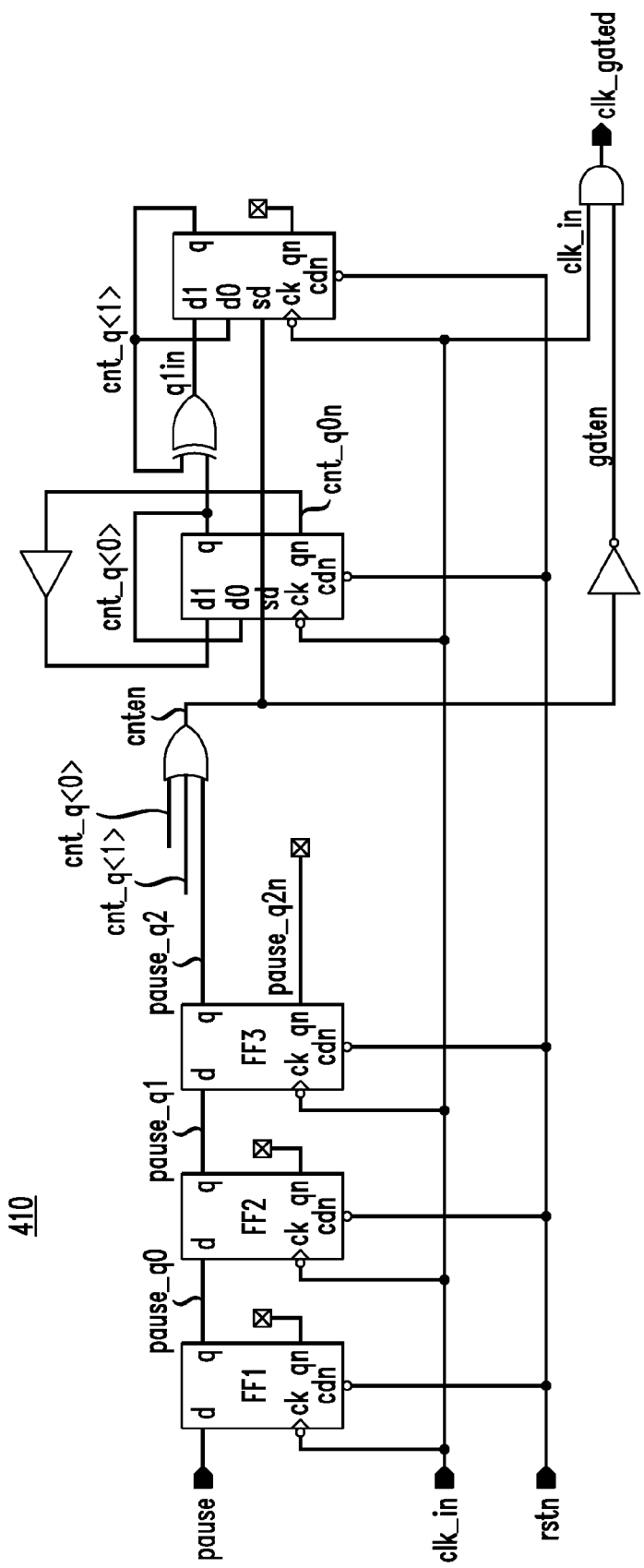
FIG. 9 shows a schematic circuit diagram of one possible implementation of the pause circuit of FIG. 4 for a gearing ratio of 4.

FIG. 9 shows a schematic circuit diagram of one possible implementation of pause circuit 410 of FIG. 4 for a gearing ratio of 4. As represented in FIG. 9, input clock signal clk_in is equivalent to input clock 402 of FIG. 4, and gated clock signal clk_gated is equivalent to first output clock 412 of FIG. 4. When the pause signal pause is asserted, pause circuit 410 prevents the input clock signal clk_in from propagating as the gated clock signal clk_gated, but only at the end of the current set of four clock cycles. Similarly, when the pause signal is de-asserted, pause circuit 410 allows the input clock signal clk_in to propagate as the gated clock signal clk_gated, but only at the beginning of the next set of four clock cycles.

Figure 10:
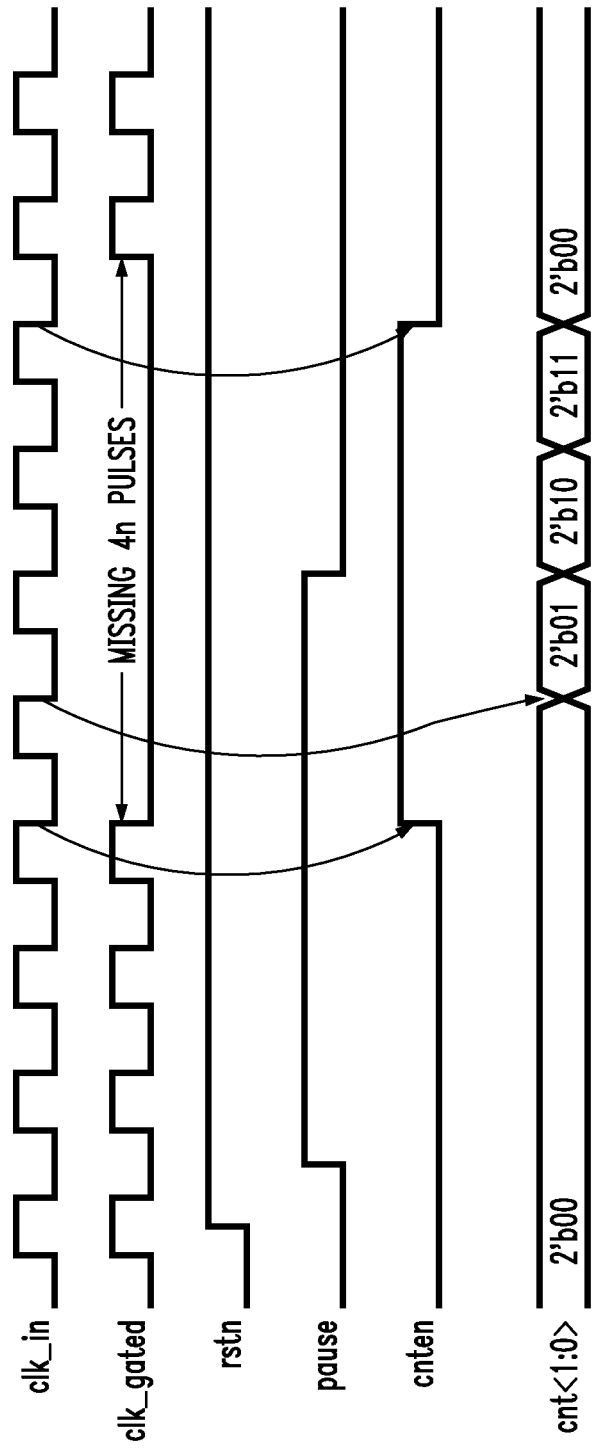
FIG. 10 shows a timing diagram representing some of the operations of the pause circuit of FIG. 9.

FIG. 10 shows a timing diagram representing some of the operations of pause circuit 410 of FIG. 9. When pause goes high, clk_gated will stop running three cycles later. Upon release of pause, pause circuit 410 will count until the 4n boundary (i.e., 4, 8, 12, . . . ) to release clk_gated. For this case with a gearing ratio of 4, the number of missing pulses are guaranteed to be 4n. For a gearing ratio of 8, the number of missing pulses would be 8n. This ensures gearing logic integrity. All word boundaries are preserved both before and after the pause. During a pause, when clk_gated is low, code_out is allowed to change in order to shift clk_gated. No runt pulse and no corruption of logic states of all downstream logic will occur.

Scenario #2: Aligned RX Clock and Data Signals

Figure 11:
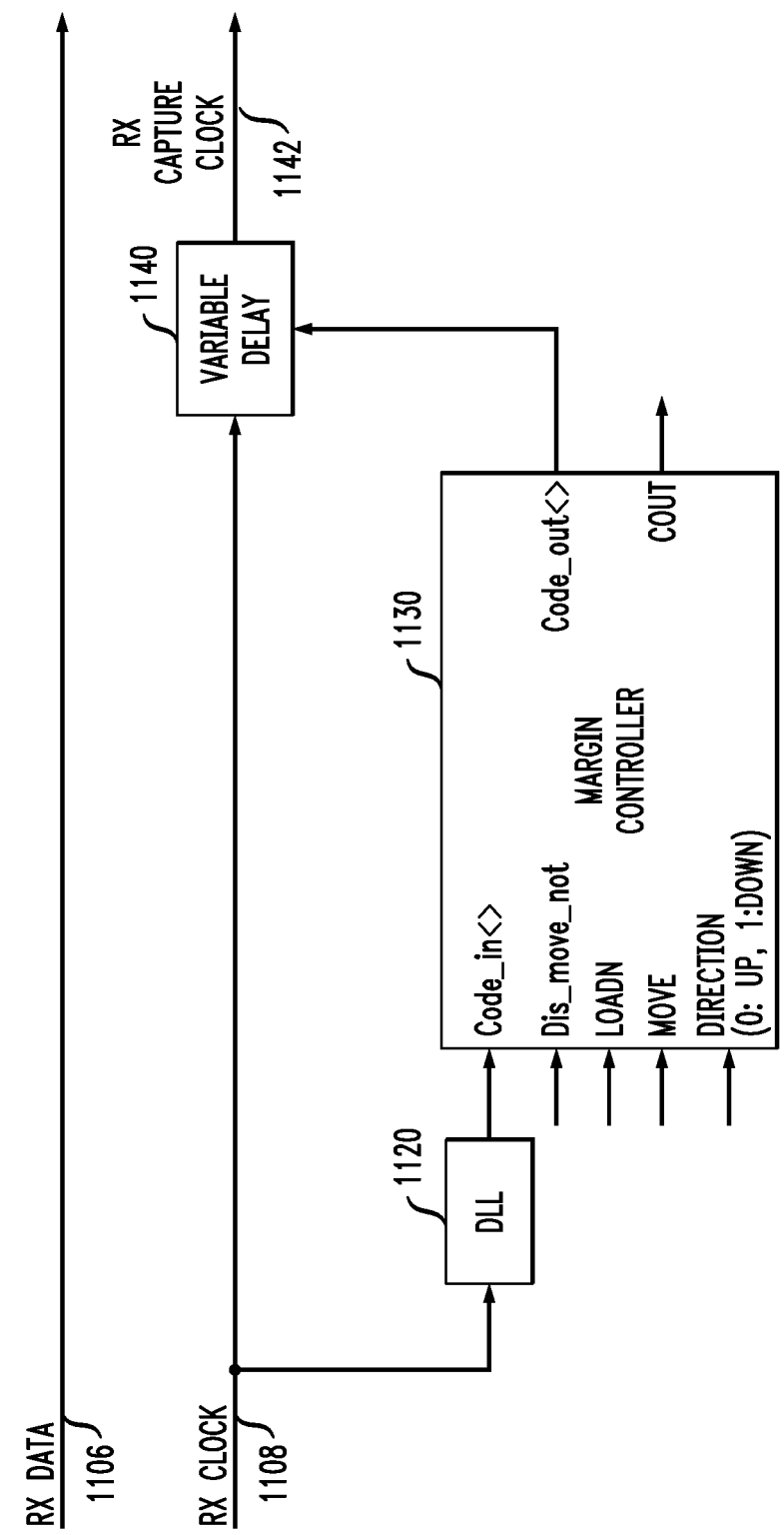
FIG. 11 shows a block diagram of a read margin circuit for a receiving device, such as the RX device of FIG. 1, for the scenario in which the clock and data signals are transmitted aligned in phase.

FIG. 11 shows a block diagram of a read margin circuit 1100 for a receiving device, such as RX device 104 of FIG. 1, for the second scenario in which the clock and data signals are transmitted aligned in phase. In this particular implementation, the received (RX) data signals 1106 are analogous to the data signals received from data bus 106 of FIG. 1, and the RX clock signal 1108 is analogous to clock signal 108 of FIG. 1. Read margin circuit 1100 applies a suitable delay to RX clock signal 1108 to generate RX capture clock 1142, which is used by downstream RX circuitry (not shown) to sample RX data signals 1106 to recover data from those signals.

In operation, like variable delay circuit 440 of FIG. 4, variable delay circuit 1140 delays RX clock signal 1108 based on the digital code signal code_out received from margin controller 1130 to generate RX capture clock 1142. In an ideal situation, RX clock and data signals 1108 and 1106 are perfectly aligned, margin controller 1130 generates the value of code_out to cause variable delay circuit 1140 to apply a 90-degree delay to RX clock signal 1108 to generate RX capture clock signal 1142 having a 90-degree phase offset relative to RX data signals 1106, and the downstream RX circuit uses the RX capture clock 1142 to sample the RX data signals 1106 at the center of their data valid windows.

In the real world, certain factors, such as PVT variations and system noise, can cause skew between the RX data signals 1106 and the RX clock signal 1108 as well as skew and jitter in the downstream RX circuitry, which can all vary from chip design to chip design, from RX device to RX device for a given chip design, and/or from time to time for a given RX device. In order to characterize this data/clock skew, like margin controller 430 of FIG. 4, margin controller 1130 is designed to vary the value of code_out over time to characterize the performance of RX device 104 for different code values. For example, for an exemplary 8-bit code signal code_out, the decimal value 127 may correspond to a 90-degree phase shift applied by variable delay circuit 1140, the decimal value 0 may correspond to a 45-degree phase shift, and the decimal value 255 may correspond to a 135-degree phase shift. In other implementations, code_out can have a number of bits other than 8 and/or the range of available phase shifts can be other than 45 degrees to 135 degrees.

In order to characterize the performance of RX device 104, margin controller 1130 could be initiated to generate a nominal code_out value of 127 and then sequentially increment that nominal value by one towards the maximum value of 255. At each different code_out value, the performance of RX device 104 can be characterized by determining whether RX device 104 can accurately recover the received data from RX data signals 1106 using the RX clock signal 1108. When the data can no longer be accurately recovered or the maximum code_out value of 255 is reached, margin controller 1130 can be re-initiated to generate the nominal code_out value of 127 and then sequentially decrement that nominal value by one towards the minimum value of 0. Here, too, at each different code_out value, the performance of RX +device 104 is characterized by determining whether RX device 104 can accurately recover the received data from RX data signals 1106 using the RX clock signal 1108. When the data can no longer be accurately recovered or the minimum code_out value of 0 is reached, the characterization process for RX device 104 is complete.

At that point, the receive data/clock skew range (a.k.a. RX margin) corresponds to the range of code_out values from the smallest code_out value at which data can be reliably recovered to the largest code_out value at which data can be reliably recovered. The RX margin can then be used to determine the efficacy of the corresponding chip design and/or the instant RX device. The RX margin can also be used to adjust the tuning of the instant RX device, e.g., by selecting a code_out value at the center of the RX margin range for use in operating the device.

Margin controller 1130 can be identical to margin controller 430 of FIG. 4, such that the schematic circuit design of margin controller 430 shown in FIG. 5 can also be used to implement margin controller 1130 of FIG. 11.

As shown in FIG. 11, in a manner analogous to DLL circuit 420 of FIG. 4, the nominal code_in value is generated by DLL circuit 1120 based on the RX clock signal 1108.

Figure 12:
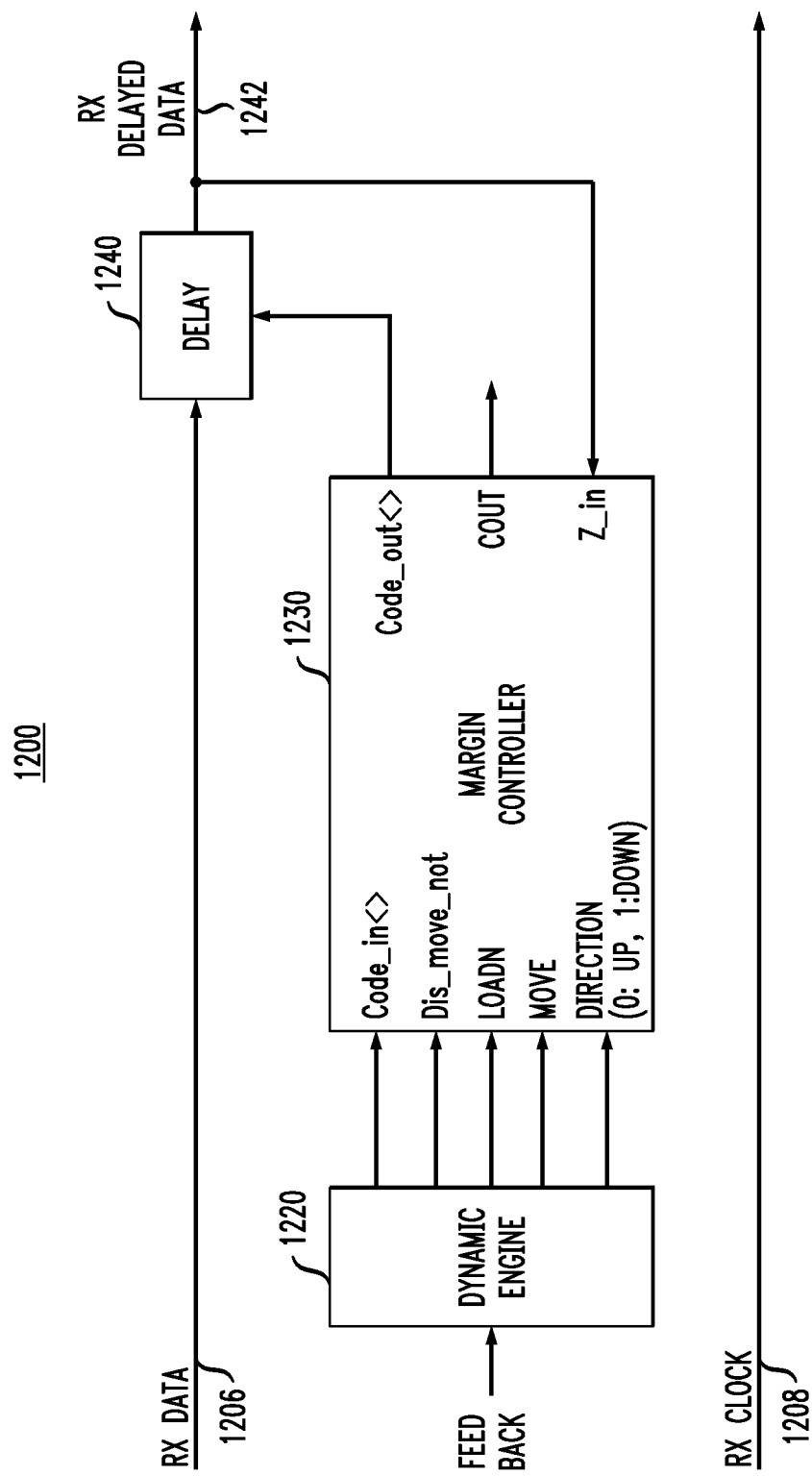
FIG. 12 shows a block diagram of an alternative read margin circuit for a receiving device, such as the RX device of FIG. 1, for the scenario in which the clock and data signals are transmitted aligned in phase.

FIG. 12 shows a block diagram of a read margin circuit 1200 for a receiving device, such as RX device 104 of FIG. 1, for the second scenario in which the clock and data signals are transmitted aligned in phase. As in FIG. 11, in this particular implementation, the RX data signals 1206 are analogous to the data signals received from data bus 106 of FIG. 1, and the RX clock signal 1208 is analogous to clock signal 108 of FIG. 1. Unlike read margin circuit 1100 of FIG. 11, which applies a suitable delay to the RX clock signal, read margin circuit 1200 applies a suitable delay to RX data signal 1206 to generate RX delayed data signals 1242, which are sampled by downstream RX circuitry (not shown) using RX clock signal 1208 to recover data from those delayed data signals.

In operation, variable delay circuit 1240 delays RX data signals 1206 based on the digital code signal code_out received from margin controller 1230 to generate RX delayed data signals 1242. In an ideal situation, RX clock and data signals 1208 and 1206 are perfectly aligned, margin controller 1230 generates the value of code_out to cause variable delay circuit 1240 to apply a 90-degree delay to RX data signals 1206 to generate RX delayed data signals 1242 having 90-degree phase offsets relative to RX clock signal 1208, and the downstream RX circuit uses the RX clock signal 1208 to sample the RX delayed data signals 1242 at the center of their data valid windows.

In the real world, certain factors, such as PVT variations and system noise, can cause skew between the RX data signals 1206 and the RX clock signal 1208 as well as skew and jitter in the downstream RX circuitry, which can all vary from chip design to chip design, from RX device to RX device for a given chip design, and/or from time to time for a given RX device. In order to characterize this data/clock skew, like margin controller 1130 of FIG. 11, margin controller 1230 is designed to vary the value of code_out over time to characterize the performance of RX device 104 for different code values. For example, for an exemplary 8-bit code signal code_out, the decimal value 127 may correspond to a 90-degree phase shift applied by variable delay circuit 1240, the decimal value 0 may correspond to a 45-degree phase shift, and the decimal value 255 may correspond to a 135-degree phase shift. In other implementations, code_out can have a number of bits other than 8 and/or the range of available phase shifts can be other than 45 degrees to 135 degrees.

In order to characterize the performance of RX device 104, margin controller 1230 could be initiated to generate a nominal code_out value of 127 and then sequentially increment that nominal value by one towards the maximum value of 255. At each different code_out value, the performance of RX device 104 can be characterized by determining whether RX device 104 can accurately recover the received data from RX data signals 1206 using the RX clock signal 1208. When the data can no longer be accurately recovered or the maximum code_out value of 255 is reached, margin controller 1230 can be re-initiated to generate the nominal code_out value of 127 and then sequentially decrement that nominal value by one towards the minimum value of 0. Here, too, at each different code_out value, the performance of RX device 104 is characterized by determining whether RX device 104 can accurately recover the received data from RX data signals 1206 using the RX clock signal 1208. When the data can no longer be accurately recovered or the minimum code_out value of 0 is reached, the characterization process for RX device 104 is complete.

At that point, the receive data/clock skew range (a.k.a. RX margin) corresponds to the range of code_out values from the smallest code_out value at which data can be reliably recovered to the largest code_out value at which data can be reliably recovered. The RX margin can then be used to determine the efficacy of the corresponding chip design and/or the instant RX device. The RX margin can also be used to adjust the tuning of the instant RX device, e.g., by selecting a code_out value at the center of the RX margin range for use in operating the device.

Margin controller 1230 can be identical to margin controller 430 of FIG. 4, such that the schematic circuit design of margin controller 430 shown in FIG. 5 can also be used to implement margin controller 1230 of FIG. 12.

As shown in FIG. 12, read margin circuit 1200 includes dynamic engine 1220, which dynamically controls the input to margin controller 1230. In particular, dynamic engine 1220 receives feedback from the downstream RX circuitry to indicate whether code_out needs to be changed. The dynamic engine of read margin circuit 1200 has the same design as corresponding circuitry in write margin circuit 400 of FIG. 4.

Figure 13:
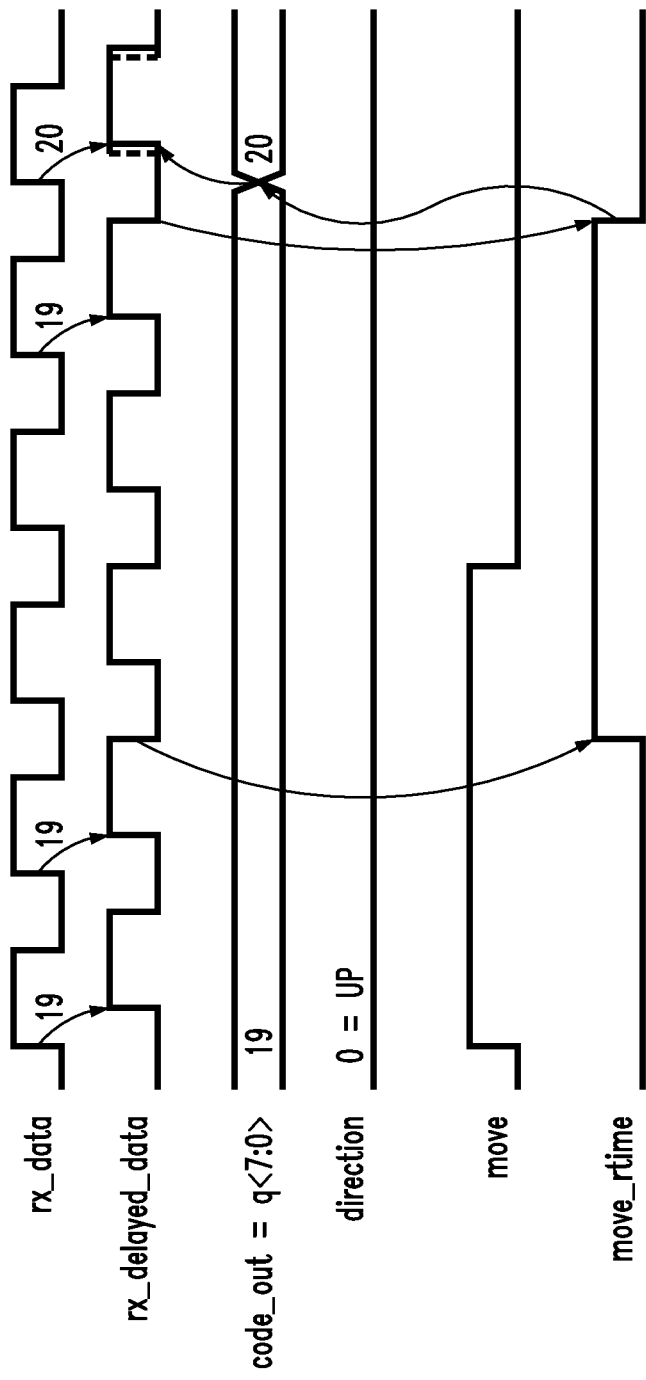
FIG. 13 shows a timing diagram representing some operations of the read margin circuit of FIG. 12.

FIG. 13 shows a timing diagram representing some operations of read margin circuit 1200 of FIG. 12. When read margin circuit 1200 is used, move will be clocked by RX delayed data 1242 applied to input port Z_in of margin controller 1230. A falling edge of move_rtime will trigger a change in code_out in order to ensure that the change in code_out occurs after the corresponding falling edge of RX delayed data 1242. move_rtime, which is not shown in FIG. 13, is move clocked twice by Z_in. In addition, the change in code_out has to finish before the next rising edge of rx_data. The overall effect is that RX delayed data 1242 will not glitch in order to avoid data corruption due to the change in code_out.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MP- GAs), simple programmable logic devices (SPLDs), and complex programmable logic devices (CPLDs).

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The present invention can also be embodied in the form of a bitstream or other sequence of signal values stored in a non-transitory recording medium generated using a method and/or an apparatus of the present invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit having a margin circuit for controlling skew between a first signal and a second signal comprising:
    a variable delay circuit (e.g., 440, 1140, 1240) configured to apply a delay to the second signal to generate a delayed second signal, wherein the magnitude of the delay is based on a current code value (e.g., code_out) received at the variable delay circuit; and
    a margin controller (e.g., 430, 1130, 1230) configured to generate the current code value for the variable delay circuit to be any one of a plurality of available code values,
    wherein the integrated circuit comprises a programmable logic device having programmable input/output (I/O) circuitry and programmable logic connected to receive incoming signals from and provide outgoing signals to the I/O circuitry.

2. The invention of claim 1, wherein the margin controller is configured to receive a nominal code value (e.g., code_in), a direction control signal (e.g., direction), and a move control signal (e.g., move), such that:
    for a first pulse in the move control signal, the margin controller increments or decrements the nominal code value based on the direction control signal to generate the current code value (e.g., code_out); and
    for a subsequent pulse in the move control signal, the margin controller increments or decrements the current code value based on the direction control signal to update the current code value.

3. The invention of claim 2, wherein the margin controller is configured to generate an overflow control signal (e.g., cout) when the current code value reaches either a maximum code value or a minimum code value.

4. The invention of claim 1, wherein:
    the margin circuit is a write margin circuit (e.g., 400) included within an integrated circuit;
    the first signal and the delayed second signal are clock signals (e.g., 412, 442); and
    the integrated circuit further comprises downstream transmit (TX) circuitry that uses the first clock signal and the delayed second clock signal to generate TX clock and data signals (e.g., 106, 108).

5. The invention of claim 4, wherein:
    the downstream TX circuitry uses the first clock signal to generate the TX clock signal; and
    the downstream TX circuitry uses the delayed second clock signal to generate the TX data signal.

6. The invention of claim 1, wherein:
    the margin circuit is a read margin circuit (e.g., 1100, 1200) included within an integrated circuit;

the first signal and the delayed second signal are receive (RX) clock and data signals (e.g., 1142/1106, 1208/ 1242); and the integrated circuit further comprises downstream RX circuitry that uses the clock to recover data from the data signal.

7. The invention of claim 6, wherein:
the first signal is the RX data signal (e.g., 1106); and
the delayed second signal is the RX clock signal (e.g., 1142).

8. The invention of claim 6, wherein:
the first signal is the RX clock signal (e.g., 1208); and
the delayed second signal is the RX data signal (e.g., 1242).

9. A method for characterizing margin of an integrated circuit having a margin circuit for controlling skew between a first signal and a second signal comprising:

providing a margin circuit for controlling skew between a first signal and a second signal, the margin circuit comprising:

a variable delay circuit (e.g., 440, 1140, 1240) configured to apply a delay to the second signal to generate a delayed second signal, wherein the magnitude of the delay is based on a current code value (e.g., code_out) received at the variable delay circuit; and a margin controller (e.g., 430, 1130, 1230) configured to generate the current code value for the variable delay circuit to be any one of a plurality of available code values;

controlling the margin controller to sequentially generate a plurality of different current code values such that the variable delay circuit sequentially applies a plurality of different delays to the second signal to sequentially generate a plurality of different delayed second signals; and characterizing, for each different delayed second signal, performance of the integrated circuit to determine the margin of the integrated circuit.

10. The invention of claim 9, wherein the margin of the integrated circuit corresponds to a range of current code values from (i) a smallest current code value for which the corresponding delayed second signal provides acceptable performance of the integrated circuit to (ii) a largest current code value for which the corresponding delayed second signal provides acceptable performance of the integrated circuit.

11. The invention of claim 9, wherein the margin controller receives a nominal code value (e.g., code_in), a direction control signal (e.g., direction), and a move control signal (e.g., move), such that:

for a first pulse in the move control signal, the margin controller increments or decrements the nominal code value based on the direction control signal to generate the current code value (e.g., code_out); and for a subsequent pulse in the move control signal, the margin controller increments or decrements the current code value based on the direction control signal to update the current code value.

12. The invention of claim 11, wherein the margin controller generates an overflow control signal (e.g., cout) when the current code value reaches either a maximum code value or a minimum code value.

13. The invention of claim 9, wherein:
the margin circuit is a write margin circuit (e.g., 400);
the first signal and the delayed second signal are clock signals (e.g., 412, 442); and the integrated circuit further comprises downstream transmit (TX) circuitry that uses the first clock signal and the delayed second clock signal to generate TX clock and data signals (e.g., 106, 108).

14. The invention of claim 13, wherein:
the downstream TX circuitry uses the first clock signal to generate the TX clock signal; and
the downstream TX circuitry uses the delayed second clock signal to generate the TX data signal.

15. The invention of claim 9, wherein:
the margin circuit is a read margin circuit (e.g., 1100, 1200);
the first signal and the delayed second signal are receive (RX) clock and data signals (e.g., 1142/1106, 1208/ 1242); and
the integrated circuit further comprises downstream RX circuitry that uses the clock to recover data from the data signal.

16. The invention of claim 15, wherein:
the first signal is the RX data signal (e.g., 1106); and
the delayed second signal is the RX clock signal (e.g., 1142).

17. The invention of claim 15, wherein:
the first signal is the RX clock signal (e.g., 1208); and
the delayed second signal is the RX data signal (e.g., 1242).

18. The invention of claim 9, wherein the plurality of different current code values comprises:
a first sub-sequence of current code values from a nominal code value (e.g., code_in) up to a maximum code value; and
a second sub-sequence of current code values from the nominal code value down to a minimum code value.

19. The invention of claim 9, wherein the integrated circuit is a programmable logic device having programmable input/output (I/O) circuitry and programmable logic connected to receive incoming signals from and provide outgoing signals to the I/O circuitry.

20. An integrated circuit having a margin circuit for controlling skew between a first signal and a second signal comprising:

a variable delay circuit (e.g., 440, 1140, 1240) configured to apply a delay to the second signal to generate a delayed second signal, wherein the magnitude of the delay is based on a current code value (e.g., code_out) received at the variable delay circuit; and a margin controller (e.g., 430, 1130, 1230) configured to generate the current code value for the variable delay circuit to be any one of a plurality of available code values, wherein the margin controller is configured to receive a nominal code value (e.g., code_in), a direction control signal (e.g., direction), and a move control signal (e.g., move), such that:

for a first pulse in the move control signal, the margin controller increments or decrements the nominal code value based on the direction control signal to generate the current code value (e.g., code_out); and for a subsequent pulse in the move control signal, the margin controller increments or decrements the current code value based on the direction control signal to update the current code value.

* * * * *